(12) United States Patent
Eyssa et al.

(10) Patent No.: US 8,981,853 B2
(45) Date of Patent: Mar. 17, 2015

(54) TRANS-IMPEDANCE AMPLIFIER FOR HIGH SPEED OPTICAL-ELECTRICAL INTERFACES

(71) Applicant: STMicroelectronics S.R.L., Agrate Brianza (IT)

(72) Inventors: Wissam Yussef Sabri Eyssa, Ceranova (IT); Enrico Stefano Temporiti Milani, Pavia (IT); Daniele Baldi, Codevilla (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 52 days.

(21) Appl. No.: 13/868,647

(22) Filed: Apr. 23, 2013

(65) Prior Publication Data

US 2013/0293301 A1   Nov. 7, 2013

(30) Foreign Application Priority Data

May 3, 2012   (IT) .............................. MI2012A0736

(51) Int. Cl.
  *H03F 3/08*   (2006.01)
  *H03F 3/45*   (2006.01)
(52) U.S. Cl.
  CPC .............. *H03F 3/45071* (2013.01); *H03F 3/08* (2013.01); *H03F 3/087* (2013.01); *H03F 3/45183* (2013.01)
  USPC ........................................................ 330/308
(58) Field of Classification Search
  CPC ............... H03F 1/18; H03F 1/26; H03F 1/32; H03F 1/42; H03F 3/087; H03F 3/1935; H03F 3/45179; H03F 3/45183; H03F 3/45475; H03F 3/607; H03F 1/08; H03F 3/08; H04B 10/66; H04B 10/6931; H04B 10/697; H04B 10/807
  USPC .................. 330/59, 308; 250/214 A, 214 AG
  See application file for complete search history.

(56) References Cited

U.S. PATENT DOCUMENTS

| 5,329,115 A | 7/1994 | Lim |
| 5,343,160 A | 8/1994 | Taylor |
| 7,505,696 B2 * | 3/2009 | Day .............................. 375/345 |

FOREIGN PATENT DOCUMENTS

JP   6224652   8/1994

OTHER PUBLICATIONS

Goldberg et al., "CMOS Limiting Optical Preamplifiers Using Dynamic Biasing for Wide Dynamic Range", IEEE International Symposium on Circuits and Systems, May 2004, pp. 217-220.
Mohan et al., "Bandwidth Extension in CMOS with Optimized On-Chip Inductors," IEEE Journal of Solid-State Circuits, vol. 35, No. 3, Mar. 2000, pp. 346-355.
Kucharski et al., "10Gb/s 15mW Optical Receiver with Integrated Germanium Photodetector and Hybrid Inductor Peaking in 0.13 um SOI CMOS Technology," IEEE International Solid-State Circuits Conference, 2010, pp. 360-362.

* cited by examiner

*Primary Examiner* — Khanh V Nguyen
(74) *Attorney, Agent, or Firm* — Allen, Dyer, Doppelt, Milbrath & Gilchrist, P.A.

(57) ABSTRACT

A differential or pseudo-differential TIA includes an auxiliary differential amplifier input transistor pair cross-coupled to the output nodes to cancel undesired output signal components. The advantages of a classical differential topology are retained while performance at a high data rate is significantly improved.

22 Claims, 3 Drawing Sheets

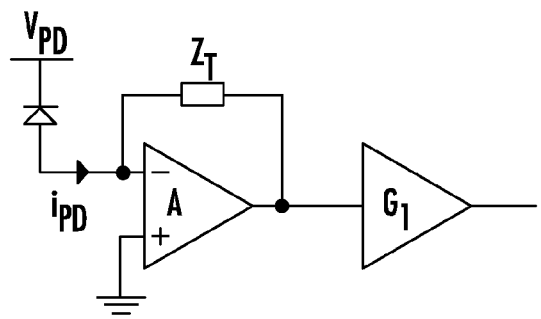
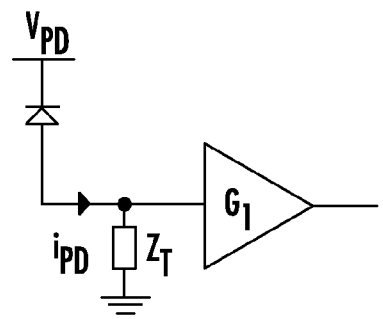
FIG. 1A
(PRIOR ART)
FIG. 1B
(PRIOR ART)
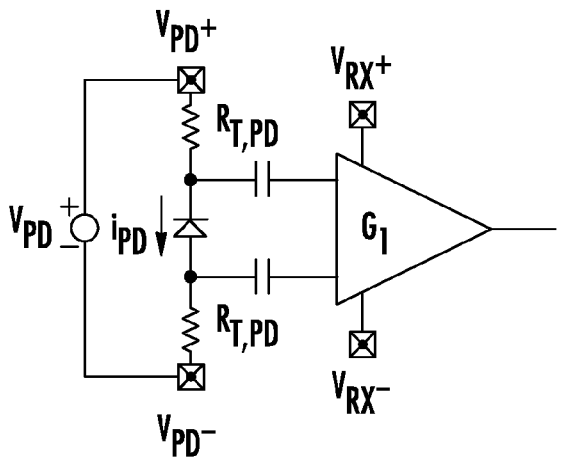
FIG. 2
(PRIOR ART)
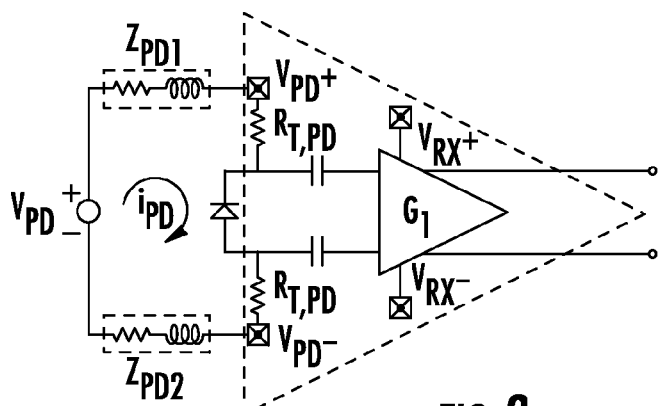
FIG. 3
(PRIOR ART)

TRANS-IMPEDANCE AMPLIFIER FOR HIGH SPEED OPTICAL-ELECTRICAL INTERFACES

FIELD OF THE INVENTION

The present invention relates to the field of Optical-Electrical (O-E) interfaces for high speed communications, and, more particularly, such interfaces suitable for silicon photonics applications.

BACKGROUND OF THE INVENTION

Optical-Electrical (O-E) interfaces are used in high speed communication systems to convert the incident light signal into an electrical signal. Typically, the O-E interface includes a photodiode (PD), to convert the incident light power into a current, and a Trans-Impedance Amplifier (TIA), to convert the photocurrent into a voltage of great enough amplitude to be managed by the following electronic stages. The TIA is generally followed by additional amplification stages to reach the desired output level and to drive the output load.

The TIA is typically considered an important block in high data rate (DR) applications since it should ensure a large analog bandwidth (BW) in order not to degrade the Inter-Symbol Interference (ISI) of the received bit stream but, at the same time, it should have a large enough gain to provide at its output a manageable voltage for the following stages. And it should maintain a low integrated noise at its output so as not to degrade the overall Signal-to-Noise Ratio (SNR), that directly impacts the output Bit Error Rate (BER).

Two TIA architectures are typically used, the feedback one and the open-loop one. The feedback architecture makes use of an amplifying stage fed back in an inverting configuration and fed at the input by the PD photocurrent iPD (FIG. 1a). The feedback impedance ZT realizes the desired trans-impedance gain. On the other hand, the open-loop architecture realizes the desired trans-impedance gain by injecting the photocurrent directly into an impedance ZT, and uses an open-loop amplifier to increase the voltage level up to the desired level (FIG. 1b).

The feedback architecture is generally preferred in presence of large input capacitances because for a given input sensitivity and a desired BER it provides a larger BW. The advantage in terms of BW directly depends on the gain A of the amplifying stage (e.g. this advantage can be quantified into a factor sqrt(A+1) in the most simplified model, assuming infinite BW and null output impedance for the amplifying stage). This advantage is achieved at the expense of a more complex architecture, that intrinsically dissipates a larger power, and that is prone to non idealities and to stability issues. These effects become more and more critical as the data rate increases (typically >10 Gbps) due to high frequency parasitic effects. In addition, a large gain A at frequencies in the range of tens of GHz is generally difficult to achieve, especially in low supply amplifiers, and this may reduces or even nullify the advantages of a feedback architecture.

To extend data rates beyond 10 Gbps, equalization techniques are typically used, and particularly feed-forward equalization based on inductive peaking (Mohan 2000). The purpose of these techniques is to enlarge the BW of the amplifying stage by emphasizing specific frequency components of the received signal (typically the high frequency components), while maintaining unmodified the other spectral components. Depending on the amount of equalization needed, this operation can be either concentrated into a single stage (typically the TIA) or distributed over several stages of the receiver chain. In most applications a programmable equalization is required, to ensure proper operation and/or uniform performance over Process Voltage and Temperature (PVT) conditions.

FIGS. 1a and 1b show typical TIA topologies with single-ended PD connection. However, a differential topology has been recently proposed and applied to an open-loop TIA architecture (FIG. 2) (Kucharsky 2010).

This topology is particularly suitable for silicon photonics applications: in fact, these can make use of a balanced waveguide PD integrated on the same silicon substrate of the electronic circuits (or on a separate silicon substrate, similar to the one used for electronic circuits). A differential topology intrinsically offers two advantages compared to a single-ended one: a 3 dB better SNR and a higher rejection of supply noise. The topology proposed in (Kucharsky 2010) implements the desired trans-resistance using two equal resistances RT,PD, connected to VPD+ and VPD− respectively to properly bias the PD, and AC-coupled to the following stage, as shown in FIG. 2, to allow proper bias of the stage itself (typically implemented by a differential pair). However this topology faces intrinsic limits discussed herein below, especially when extended to applications with high DR.

Even if the topology is differential, the PD generated photocurrent is forced over a single-ended path through the two RT,PD trans-resistances before being converted into a differential voltage. This is undesirable at frequencies in the range of tens of GHz, because the path between VPD+ and VPD− is generally a good short circuit only at low frequencies, but it is not well characterized at frequencies in the range of tens of GHz. This effect can be modeled by two impedances ZPD1,2 in series with RT,PD, as shown in FIG. 3, whose value is not well characterized. In the most common case of a G1 stage realized as a differential (or pseudo-differential) pair, as shown in FIG. 4 for a pseudo-differential MOS implementation (for the sake of simplicity, the bias circuitry of the pseudo-differential pair is not shown), this results into a not well predictable deviation of the TIA trans-impedance gain from the ideal value 2gmZT,PDZL (where, compared to FIG. 3, RT,PD has been generalized into ZT,PD) to a value 2gmZT,PDZL+m (ZPD1+ZPD2) ZL, with gm indicating the transconductance of the MOS transistors.

Any undesired noise coupled on the PD supplies can significantly degrade the jitter performance at the TIA output.

Any asymmetry in the values of the two ZPD1,2 impedances moves the behavior of the circuit far from the ideal balanced one.

SUMMARY OF THE INVENTION

An objective is to address the above identified drawbacks and limitations of open loop TIA with differential or pseudo-differential topology.

The differential topology of a trans-impedance amplifier as disclosed herein may retain the advantages of a classical differential topology depicted in the known circuit diagrams of FIGS. 2, 3 and 4, while effectively overcoming the drawbacks discussed above at points 1), 2) and 3) that may severely manifest themselves in high data rate (DR) applications.

A differential or pseudo-differential TIA comprising an auxiliary differential amplifier input transistor pair coupled to the output nodes in phase opposition to the first differential amplifier input transistor pair, with which it shares the same load impedances, has been found to retain the advantages of a classical differential topology (see above) and to perform well even in applications with high DR, by effectively addressing the above discussed shortcomings of prior art topologies.

Basically, the topology disclosed herein addresses the apparently uncorrelated shortcomings of the known differential or pseudo-differential TIA topologies at high DR, and is characterized by the introduction of a second auxiliary differential amplifier, including a differential pair of input transistors identical to those of the main differential pair of input transistors, and sharing the same loads and coupled in phase opposition to the output nodes of the TIA.

The effect of the auxiliary differential amplifier input pair of transistors is to cancel or reduce in practice the effects of the poorly characterizable response-modeling, series input impedances that are added to primary input impedances in the known architectures, thus recovering a condition that makes the output voltage determined primarily or only by the two well characterized primary input impedances ZT, PD. The desired end result is that the TIA trans-impedance gain reliably corresponds to the ideal value and this is surprisingly achieved with the relatively straightforward architecture described herein.

BRIEF DESCRIPTION OF THE DRAWINGS

FIG. 1a shows a typical TIA in a feedback configuration as in the prior art.

FIG. 1b show a typical TIA in an open-loop configuration as in the prior art.

FIG. 2 shows a TIA in an open-loop configuration and having a differential circuit topology as in the prior art.

FIG. 3 shows a model of two uncharacterized input series impedances introduced in a differential TIA in open-loop configuration as in the prior art.

DETAILED DESCRIPTION OF THE PREFERRED EMBODIMENTS

Figure 5:
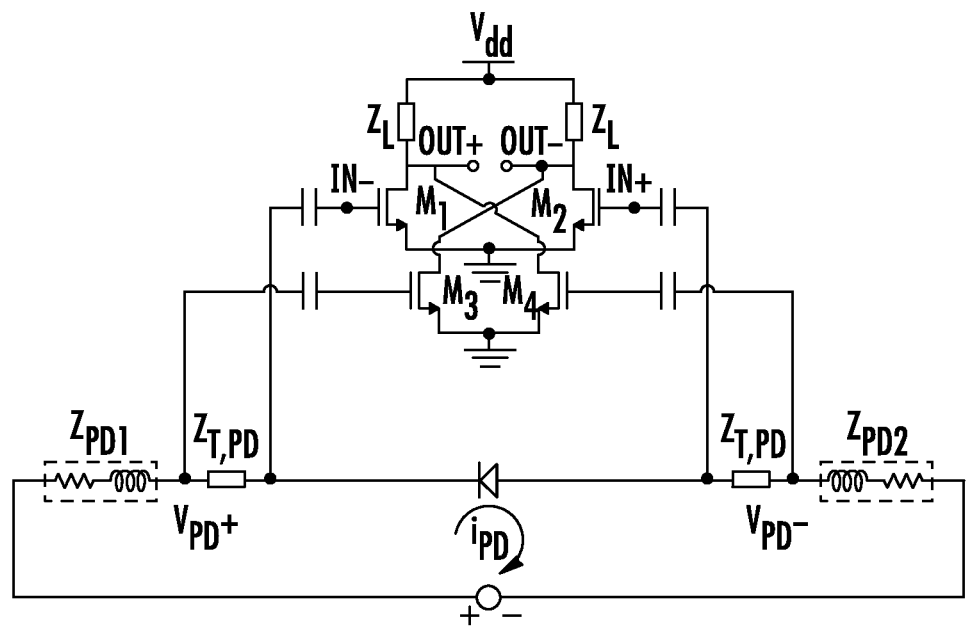
FIG. 5 shows a basic sample embodiment of the differential, open-loop configuration TIA, with auxiliary differential pair input transistor pair, according to an implementation of the invention.

A basic circuit diagram of the differential, open-loop configuration TIA, with an auxiliary differential input transistor pair, according to a pseudo-differential implementation is depicted in FIG. 5, wherein for sake of simplicity, the bias circuitry of the pseudo-differential pairs is not shown.

Figure 4:
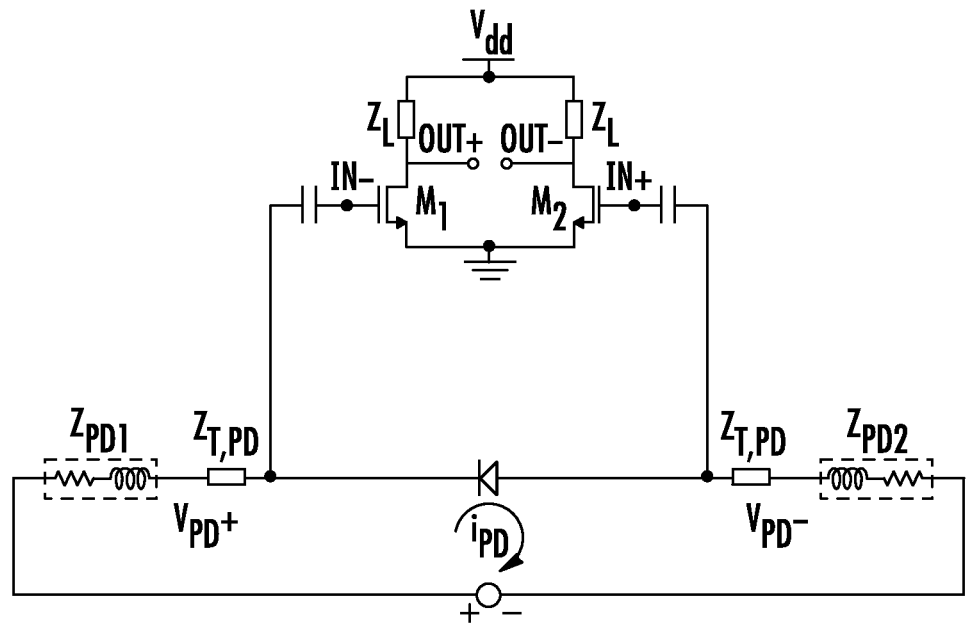
FIG. 4 depicts the trans-impedance gain model for a pseudo-differential input transistor pair as in the prior art.

Compared to the known topology of FIG. 4, the impact of the poorly characterized input series impedances ZPD1,2 is eliminated by introducing the auxiliary differential pair of input transistors M3-M4, identical to the main differential pair M1-M2, and sharing the same loads ZL.

The gates of the auxiliary pair are AC connected through blocking capacitors to the two bias nodes of the photodiode VPD+ and VPD−, respectively, as shown in FIG. 5, i.e. to the nodes on which undesired non-negligible voltages may develop when operating at very high frequencies as discussed in relation with the known topologies. This auxiliary differential input transistor pair effectively cancels the degrading effects of the two poorly characterized impedances ZPD1 and ZPD2, on the output nodes of the TIA, on which the output voltage is thus determined only by the two impedances ZT,PD, even at very high frequencies. Thus, the TIA trans-impedance gain is 2gmZT,PDZL, practically equal to the ideal value.

According to a preferred embodiment considered, the ZT,PD and/or ZL impedances may include peaking inductors in order to increase the bandwidth (BW).

Figure 6:
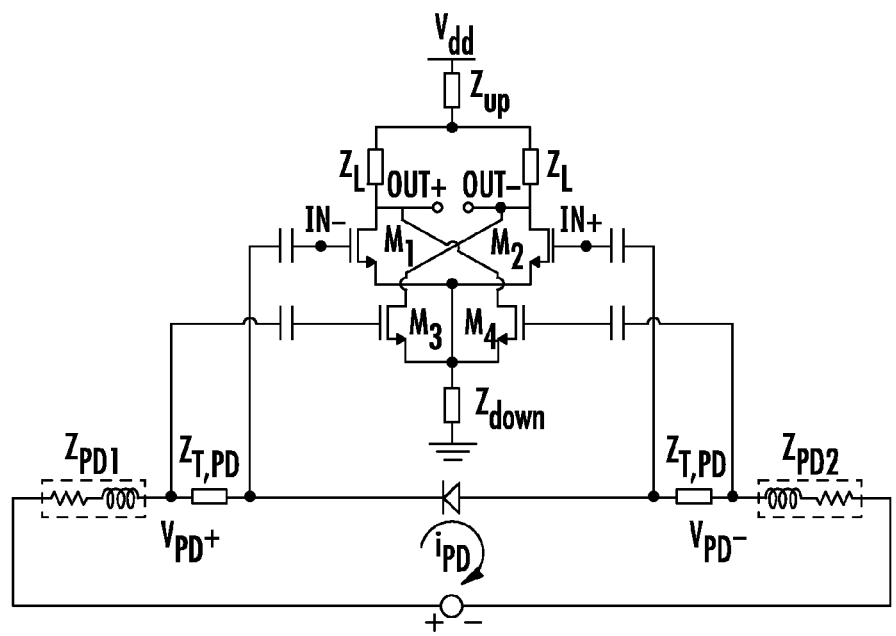
FIG. 6 shows another embodiment of the differential open-loop configuration TIA of this invention, including non-null impedances on the supply and ground current paths.

Naturally, the auxiliary input transistor pair M3-M4, coupled in phase opposition to the output nodes of the TIA according to this embodiment, remains effective even in the case of non-null impedances on the supply (vdd)/ and ground (gnd) current paths, as respectively indicated by Zup and Zdown in the exemplary embodiment of circuit diagram depicted in FIG. 6.

The alternative circuit topologies are suitable for differential or pseudo-differential circuit applications, and particularly for silicon photonics applications.

Figure 7A:
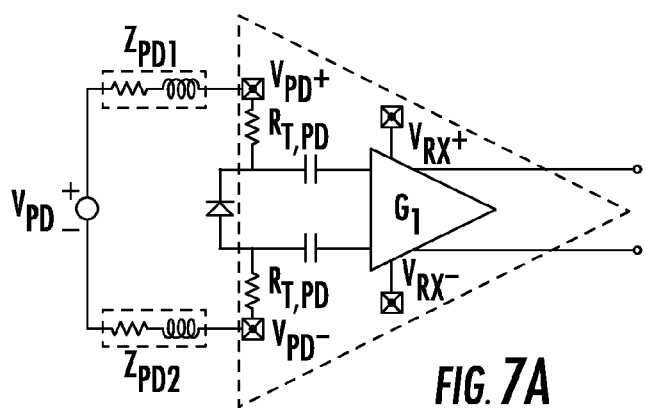
FIGS. 7a and 7b show yet other sample embodiments of the differential open-loop configuration TIA of this invention, including by-pass input capacitance with a) a lumped structure and b) a distributed structure, respectively.

The TIA architectures may be further enhanced for reducing the impact, especially at high frequencies, of the parasitic capacitance associated with the PD by adding a bypass capacitance between the VPD+ and VPD− nodes, as shown in FIG. 7(a).

Figure 7B:
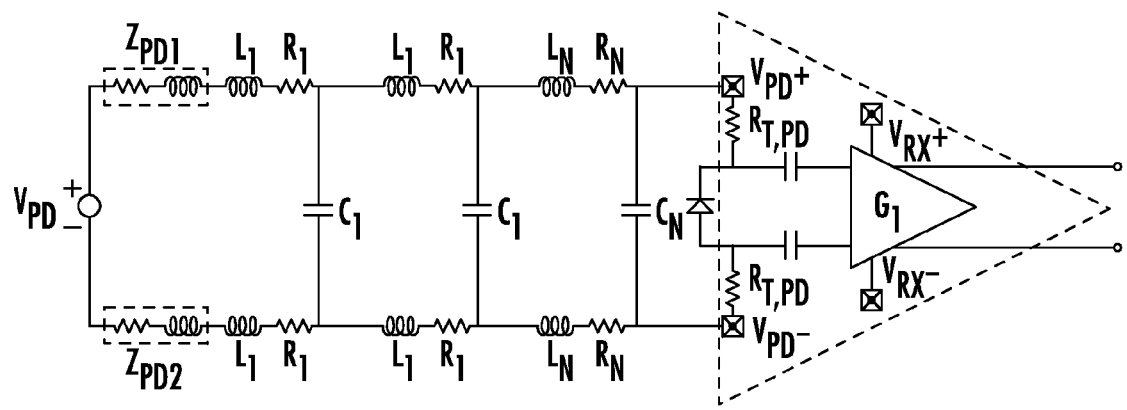

Moreover, predictability of the bypass effect up to frequencies of several tens of GHz may be further improved by substituting a lumped bypass capacitance with a distributed R-L-C structure, realized, for example, via alternated signal transmission lines and lumped capacitances as schematically shown in FIG. 7(b), making-up for the desired total capacitance value.

That which is claimed is:

1. A differential trans-impedance amplifier circuit comprising:
    a positive voltage bias node and a negative voltage bias node;
    a photodiode comprising an anode and a cathode;
    a pair of identical series impedances coupling said anode to said negative voltage bias node and coupling said cathode to said positive voltage bias node respectively;
    a pair of load impedances;
    a pair of output nodes;
    a first differential input transistor pair, comprising a first pair of input nodes coupled to said anode and cathode respectively, and coupled to said pair of load impedances to generate on said pair of output nodes a first amplified replica of a differential voltage on said first pair of input nodes;
    a second differential input transistor pair being identical to said first differential input transistor pair, said second differential input transistor pair
    sharing said pair of load impedances with said first differential input transistor pair
    comprising a second pair of input nodes, and
    configured to generate on said pair of output nodes a second amplified replica of the differential voltage on said second pair of input nodes in phase opposition to the first amplified replica of the differential voltage on said first pair of input nodes; and
    a pair of blocking capacitors coupling said second pair of input nodes to said positive voltage bias node and said negative voltage bias node respectively.

2. The differential trans-impedance amplifier circuit of claim 1, wherein said pair of identical series impedances each comprises a programmable inductance.

3. The differential trans-impedance amplifier circuit of claim 1, wherein said pair of load impedances each comprises a programmable inductance.

4. The differential trans-impedance amplifier circuit of claim 1, further comprising a bypass capacitive element coupled between said positive voltage bias node and said negative voltage bias node.

5. The differential trans-impedance amplifier circuit of claim 4, wherein said bypass capacitive element comprises a multistage distributed network including a pair of distributed R-L lines, and a plurality of bypass capacitors coupled between said pair distributed R-L lines.

6. The differential trans-impedance amplifier circuit of claim 4, wherein said bypass capacitive element comprises a multistage distributed network including a pair of distributed R-L-C lines, and a plurality of bypass capacitors coupled between said pair distributed R-L-C lines.

7. The differential trans-impedance amplifier circuit of claim 1, wherein said first differential input transistor pair comprises a first pseudo-differential input transistor pair.

8. The differential trans-impedance amplifier circuit of claim 1, wherein said second differential input transistor pair comprises a second pseudo-differential input transistor pair.

9. A differential trans-impedance amplifier for a photodiode, comprising:
   a positive voltage bias node and a negative voltage bias node;
   a pair of series impedances configured to couple the photodiode to said negative voltage bias node and said positive voltage bias node respectively;
   a pair of load impedances;
   a pair of output nodes;
   a first differential input transistor pair coupled to said pair of load impedances and configured to generate on said pair of output nodes a first amplified replica of a differential voltage on the photodiode;
   a second differential input transistor pair sharing said pair of load impedances with said first differential input transistor pair and configured to generate on said pair of output nodes a second amplified replica of the differential voltage in phase opposition to the first amplified replica; and
   a bypass capacitive element coupled between said positive voltage bias node and said negative voltage bias node.

10. The differential trans-impedance amplifier of claim 9, further comprising a pair of blocking capacitors coupling said second differential input transistor pair to said positive voltage bias node and said negative voltage bias node respectively.

11. The differential trans-impedance amplifier of claim 9, wherein said pair of series impedances each comprises a programmable inductance.

12. The differential trans-impedance amplifier of claim 9, wherein said pair of load impedances each comprises a programmable inductance.

13. The differential trans-impedance amplifier of claim 9, wherein said bypass capacitive element comprises a multistage distributed network including a pair of distributed R-L lines and a plurality of bypass capacitors coupled between said pair distributed R-L lines.

14. The differential trans-impedance amplifier of claim 9, wherein said bypass capacitive element comprises a multistage distributed network including a pair of distributed R-L-C lines and a plurality of bypass capacitors coupled between said pair distributed R-L-C lines.

15. The differential trans-impedance amplifier of claim 9, wherein said first differential input transistor pair comprises a first pseudo-differential input transistor pair.

16. The differential trans-impedance amplifier of claim 9, wherein said second differential input transistor pair comprises a second pseudo-differential input transistor pair.

17. A trans-impedance amplification method for a photodiode, the method comprising:
   operating a first differential input transistor pair coupled to a pair of load impedances to generate on a pair of output nodes a first amplified replica of a differential voltage on the photodiode;
   operating a second differential input transistor pair sharing the pair of load impedances with the first differential input transistor pair to generate on the pair of output nodes a second amplified replica of the differential voltage in phase opposition to the first amplified replica;
   operating a pair of series impedances between the photodiode and a negative voltage bias node and a positive voltage bias node respectively; and
   operating a pair of blocking capacitors between the second differential input transistor pair and the positive voltage bias node and the negative voltage bias node respectively.

18. The method of claim 17, wherein the pair of series impedances each comprises a programmable inductance.

19. The method of claim 17, wherein the pair of load impedances each comprises a programmable inductance.

20. The method of claim 17, further comprising operating a bypass capacitive element between the positive voltage bias node and the negative voltage bias node.

21. The method of claim 17, wherein the first differential input transistor pair comprises a first pseudo-differential input transistor pair.

22. The method of claim 17, wherein the second differential input transistor pair comprises a second pseudo-differential input transistor pair.

* * * * *